(12) United States Patent
Van De Walle

(10) Patent No.: US 6,605,832 B2
(45) Date of Patent: Aug. 12, 2003

(54) SEMICONDUCTOR STRUCTURES HAVING REDUCED CONTACT RESISTANCE

(75) Inventor: Christian G. Van De Walle, Sunnyvale, CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 09/682,174

(22) Filed: Jul. 31, 2001

(65) Prior Publication Data

US 2003/0025113 A1 Feb. 6, 2003

(51) Int. Cl.[7] .......................................... H01L 21/8249
(52) U.S. Cl. ........................ 257/200; 257/184; 257/189
(58) Field of Search ................................. 257/184, 189, 257/200; 438/22, 46, 47

(56) References Cited

U.S. PATENT DOCUMENTS

| | | | |
|---|---|---|---|
| 6,100,586 A | * | 8/2000 | Chen et al. |
| 2002/0000563 A1 | * | 1/2002 | Udagawa |

* cited by examiner

*Primary Examiner*—Long Pham
(74) *Attorney, Agent, or Firm*—Oliff & Berridge, PLC.

(57) ABSTRACT

The performance of nitride based diodes is currently limited by the resistivity of the ohmic contacts to the p-type GaN. The large value of the contact resistance contributes to a large voltage for device operation. This in turn causes device heating, making cw operation difficult and limiting the device lifetime. A layer of GaP or GaNP alloy between the GaN and the metal contact layer serves to bridge the energetic barrier between the GaN valence band and the metal Fermi level, thus enhancing the hole injection and reducing the contact resistance.

20 Claims, 4 Drawing Sheets

SEMICONDUCTOR STRUCTURES HAVING REDUCED CONTACT RESISTANCE

BACKGROUND OF THE INVENTION

1. Field of Invention

The invention is directed to group III–V nitride semiconductor devices.

2. Description of Related Art

III–V semiconductors are compound semiconductors containing a group III element and a group V element. Gallium nitride (GaN) is one such semiconductor, with gallium from group III and nitrogen from group V. GaN is useful in laser diodes, and is especially useful in emitting light in the blue or UV region of the electromagnetic spectrum. GaN is able to emit in this region due to its large band gap. The large band gap of GaN allows emission of light with a large energy and short wavelength, which are characteristics of the blue or UV part of the electromagnetic spectrum.

Nevertheless, the large band gap present in many nitride-based group III–V semiconductors creates a large p-type contact resistance between the semiconductor structures and the metal contacts used in such group III–V semiconductor devices. This large contact resistance arises because of the difference between the energy level of the valence band in the group III–V material and the Fermi level of the metal used to form the metal contacts. The large contact resistance contributes to the large voltage required to drive these group III–V semiconductor devices, which leads to greater power use, can cause device heating and operational difficulties, and can cause device degradation and limited device life.

As a possible solution, high p-doping of GaN may allow carriers to tunnel through the barrier between the metal contacts and the semiconductor structures. However, obtaining such high p-dopant levels may itself be difficult for other reasons.

SUMMARY OF THE INVENTION

Forming high quality ohmic contacts to group III–V semiconductor materials, such as, for example, p-type gallium nitride, is an outstanding problem in nitride device design. The lineup between the gallium nitride valence band and the Fermi level of most metals is such that a large offset exists. That is, a large p-type Schottky barrier height, $\phi_p$, occurs. This large Schottky barrier height $\phi_p$ makes it difficult to inject holes into the gallium nitride valence band. Even metals with large values for the work function, such as gold, nickel, palladium and platinum, having work function values of 5.1 to 5.5 eV, 5.1 to 5.4 eV, 5.1 to 5.6 eV, and 5.7 eV, respectively, fail to produce a Schottky barrier height $\phi_p$ that is sufficiently small to facilitate hole injection, because of the low energetic position of the gallium nitride valence band.

This invention provides methods for forming group III–V semiconductor devices having contact interlayers between the metal contact layer and the active group III–V semiconductor structure.

This invention separately provides a semiconductor device having a variable group III–V contact interlayer between a first group III–V material and a metal contact layer.

This invention further provides a variable group III–V contact interlayer that has a plurality of homogenous sublayers, each homogeneous sublayer having a different composition.

This invention alternatively further provides a variable group III–V contact interlayer that has at least one heterogeneous layer, each heterogeneous layer having a varying composition.

In various exemplary embodiments of a semiconductor device according to this invention, a gallium phosphide or gallium nitride phosphide interlayer is used to achieve contact formation on p-type gallium nitride. In the various exemplary embodiments, gallium phosphide is used because the energetic position of its valence band is about 1.3 eV above the valence band of the gallium nitride. This higher valence band position makes it much easier to form a p-type ohmic contact between gallium phosphide and the metal contact layers. An interlayer of gallium phosphide or of gallium nitride phosphide between the metal contact layer and the p-doped gallium nitride semiconductor structure therefore facilitates hole injection into the p-doped gallium nitride.

In various exemplary embodiments, a gallium phosphide interlayer or a gallium nitride phosphide interlayer can be used to divide the large energy difference between the metal contact layer and the gallium nitride semiconductor structure. In various other exemplary embodiments, multiple layers with varying concentrations of phosphide or nitride phosphide may also be used to divide the large energy difference between the metal contact layer and the gallium nitride semiconductor structure. In still other various exemplary embodiments, grading the composition of a $GaN_{1-x}P_x$ interlayer from pure gallium nitride towards an increasingly higher proportion of phosphide can be used to divide the large energy difference between the metal contact layer and the gallium nitride semiconductor structure. It should also be appreciated that two or more such heterogeneous composition interlayers would also be used.

The structure of this invention is not limited to forming an ohmic contact to gallium nitride, but also applies to contacts to other nitrides, InN, AlN or nitride alloys (InGaN, AlGaN, AlInN).

These and other features and advantages of this invention are described in, or are apparent from, the following detailed description of various exemplary embodiments of the systems and methods according to this invention.

BRIEF DESCRIPTION OF DRAWINGS

Various exemplary embodiments of this invention will be described in detail, with reference to the following figures, wherein.

DETAILED DESCRIPTION OF THE PREFERRED EMBODIMENT

The following detailed description of this invention is focused on GaP and GaPN contact interlayers between a metal contact layer and p-type doped GaN semiconductor layer. However, it should be appreciated that this invention is not limited to such materials, for either the base semiconductor layer or for the contact interlayers. In general, this invention can be used with any group III–V semiconductor layer to which a metal contact is desired, but for which the contact resistance will be larger than desired. Likewise, any group III–V semiconductor materials having an appropriate relationship according to this invention with the valence level and the work function values of the base semiconductor material and the metal used in the contact can be used in the systems and methods according to this invention.

In particular, the semiconductor materials usable in this invention are not limited to gallium nitride, but also includes other nitrides, such as InN or AlN, or nitride alloys, such as InGaN, AlGaN, or AlInN. Thus, it should be appreciated that the following exemplary embodiments are illustrative only, and are not intended to limit the literal or equivalence scope of the appended claims.

Figure 1:
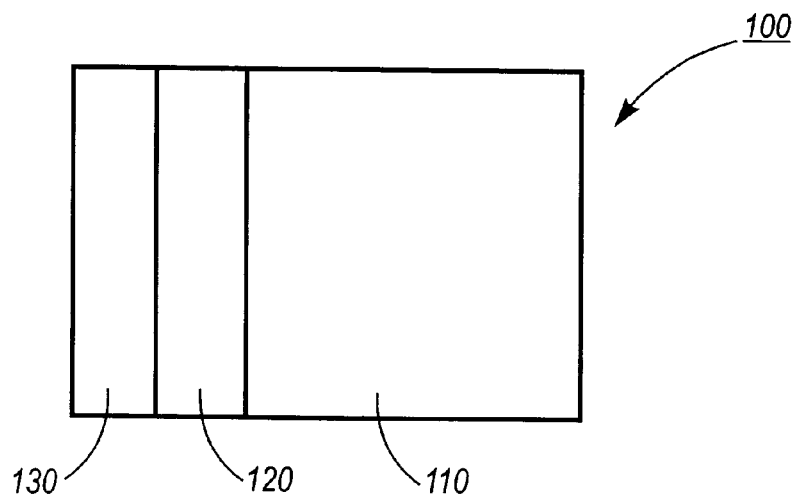
FIG. 1 shows the general structure of a first exemplary embodiment of a semiconductor device having a semiconductor contact interlayer according to this invention.

FIG. 1 shows the structure of a first exemplary embodiment of a semiconductor device 100 according to this invention. As shown in FIG. 1, the semiconductor device 100 includes a first group III–V layer 110. A second group III–V layer 120 is formed on or over the first group III–V layer 110. A metal layer 130 is formed on or over the second group III–V layer 120. In various exemplary embodiments, the first group III–V layer 110 is a gallium nitride layer. However, it should be appreciated that any known or later-developed group III–V type semiconductor material that has an undesirably large energy difference with the metal used in the metal layer 130 can be used in the first semiconductor layer 110 according to this invention.

When the group III–V layer 110 is formed of gallium nitride, the group III–V layer 110 is doped with a suitable acceptor, such as magnesium.

Figure 2:
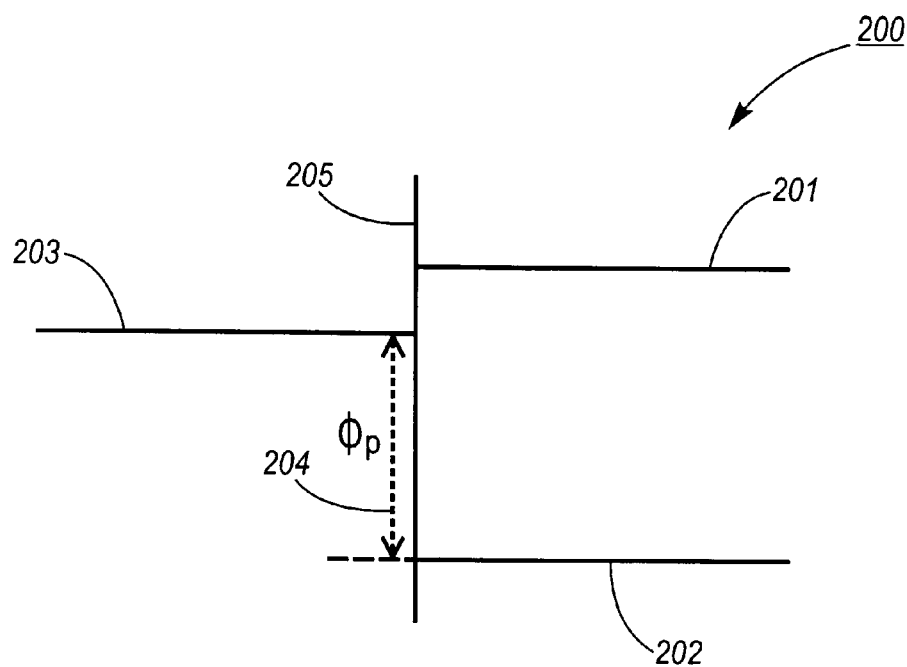
FIG. 2 schematically illustrates the band lineup between different materials under flat band conditions.

FIG. 2 schematically illustrates the band lineup between different materials under flat band conditions. In particular, a first material, such as a metal, has a Fermi level 203 that is offset from the valence band 202 of a second material, such as a semiconductor. In flat-band conditions, the conduction band 201 and the valence band 202 of the semiconductor material are parallel with the Fermi level 203 of the metal. The difference between the Fermi level 203 of the metal and the valence band 202 of the semiconductor is the p-type Schottky barrier height $\phi_p$ 204 which occurs at the metal semiconductor junction 205.

Figure 3:
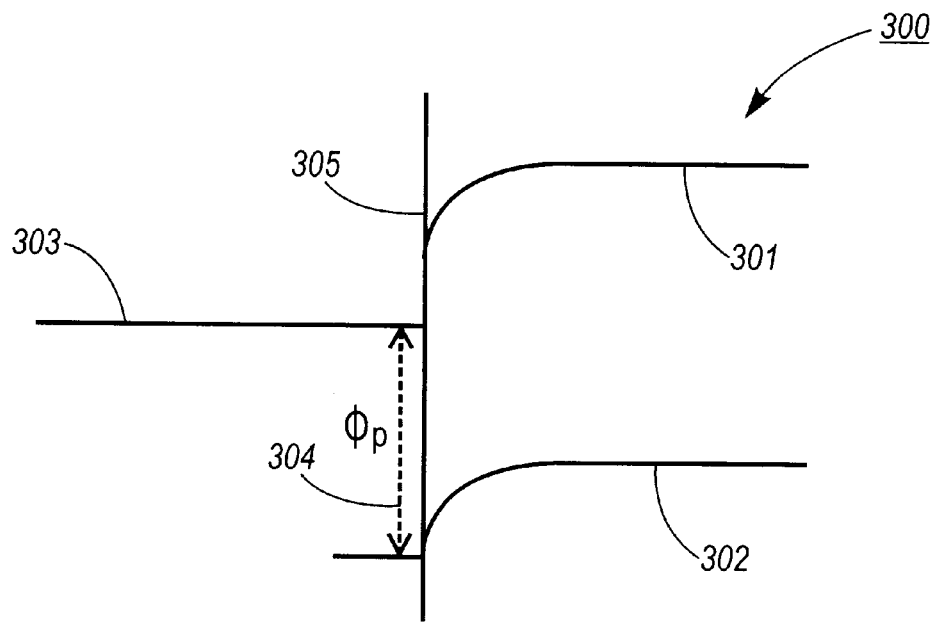
FIG. 3 schematically illustrates the band lineup between different materials including the effect of band bending.

FIG. 3 schematically illustrates the band lineup between different materials when the effect of band bending is included. In particular, a first material, such as a metal, has a Fermi level 303 that is offset from the valence band 302 of the second material, such as a semiconductor that is doped. The conduction band 301 and the valence band 302 of the doped semiconductor material are bent near the metal-doped semiconductor junction 305. The Fermi level 303 of the metal and the Fermi level of the doped semiconductor (not shown) must align in equilibrium. However, it should be appreciated that the Schottky barrier height $\phi_p$ 304 is the same as the Schottky barrier height $\phi_p$ 204.

Figure 4:
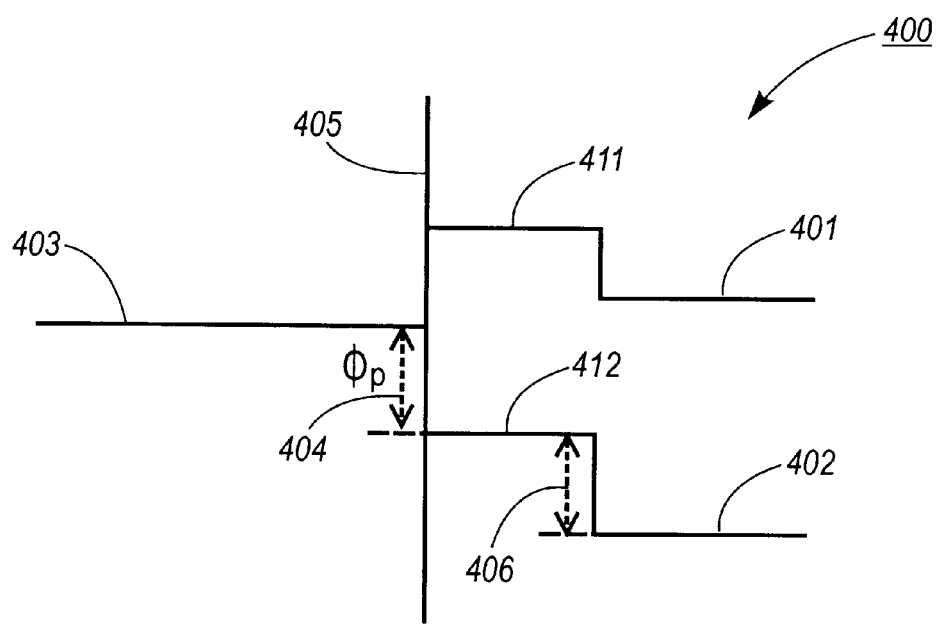
FIG. 4 schematically illustrates the band lineup at the junctions between the metal and the semiconductor layer in the semiconductor structure shown on FIG. 1.

FIG. 4 schematically illustrates the band lineup at the junction between the metal layer 130 and the first and second semiconductor layers 110 and 120 of the semiconductor structure 100 shown in FIG. 1. The band bending that generally occurs in the semiconductor structure 100 at the end near the metal semiconductor junction 405 is not shown for simplicity. In particular, the addition of the second group III–V layer 120 between the first group III–V layer 110 and the metal layer 130 creates a step in the band structure 400. The valence band 412 and the conduction band 411 of the second group III–V semiconductor material 120 are both offset from the valence band 402 and conduction band 401 of the first group III–V semiconductor material 110.

The valence-band offset 406 is the energy difference between the valence band of the second group III–V semiconductor material 120 and the valence band of the first group III–V semiconductor 110. If the first semiconductor 110 is GaN and the second semiconductor 120 is GaP, the valence-band offset 406 is about 1.3 eV. As shown in FIG. 4, the Schottky barrier height $\phi_p$ 404 between the valence band of the second semiconductor layer 120 and the Fermi level 403 of the metal of the metal layer 130 is decreased accordingly.

It should also be appreciated that the contact resistance depends exponentially on the Schottky barrier height $\phi_p$ 404. Likewise, the interlayer resistance between the first and second semiconductor layers 110 and 120 is an exponential function of the band offset 406. Thus, the contact resistance between the metal layer 130 and the second semiconductor layer 120 is reduced relative to an undivided contact resistance that would occur if the metal layer 130 were formed on the first semiconductor layer 110. Additionally, the overall resistance (i.e., the sum of the contact resistance and the interlayer resistance) is less than the undivided contact resistance. In a realistic structure, band bending effects occur that bring the Fermi levels of the semiconductors and the metal in alignment, but they would not change the arguments made above for the flat-band conditions.

Figure 5:
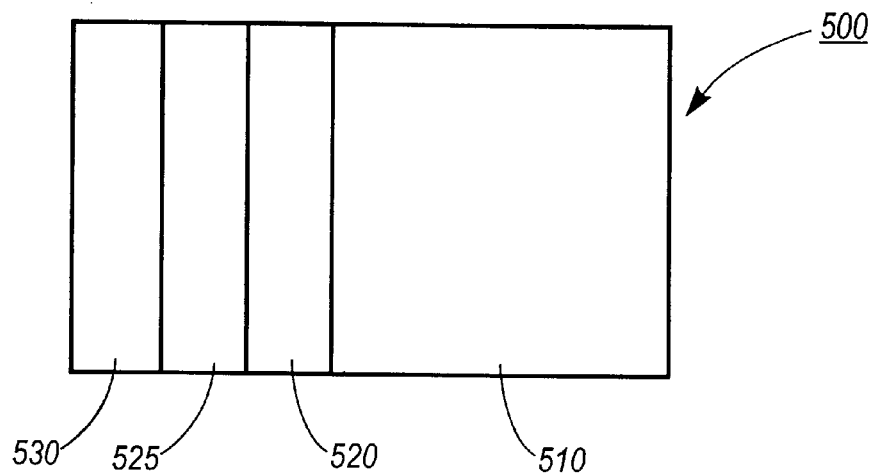
FIG. 5 shows the structure of a second exemplary embodiment of a semiconductor device having a plurality of semiconductor contact interlayers according to this invention.

FIG. 5 shows the structure of a second exemplary embodiment of the semiconductor device 500 according to this invention. As shown in FIG. 5, in this second exemplary embodiment, the semiconductor device 500 includes the first group III–V layer 110, the second group III–V layer 120 formed on or over the first group III–V layer 110, and a third group III–V layer 125 formed on or over the second group III–V layer 120. The metal layer 130 is formed on or over the third group III–V layer 125.

In various exemplary embodiments, the first group III–V layer 110 is a gallium nitride layer. However, it should be appreciated that any known or later-developed group III–V type semiconductor material that has an undesirably large energy difference with the metal layer 130 can be used in the first semiconductor layer 110 according to this invention. Again, when the group III–V layer 110 is formed of gallium nitride, the group III–V layer 110 is doped with a suitable acceptor, such as magnesium.

The first and second separate interlayers 120 and 125 have a valence band that is higher than that of the first group III–V semiconductor layer 110. For instance, the third group III–V layer 125 may be a layer of gallium phosphide. In contrast, the second group III–V layer 120 may be a layer of gallium nitride phosphide. Moreover, it should be appreciated that, in other various exemplary embodiments, there may be additional contact interlayers, beyond the second and third group III–V layers 120 and 125, between the first group III–V semiconductor layers 110 and the metal layer 130. Each group III–V semiconductor contact interlayer, such as the second and third group III–V layers 120 and 125 may have varying ratios of nitrogen and/or phosphorous or other appropriate elements. It should be noted that, although a mixture of phosphorous and nitrogen is used in the disclosed exemplary embodiment, any known or later-developed group III–V type semiconductor material that has a valence band that is higher than the first group III–V semiconductor layer 110 may be used as a contact interlayer between the first group III–V semiconductor 110 and the metal layer 130 in the second exemplary embodiment of the semiconductor structure 100 according to this invention.

Figure 6:
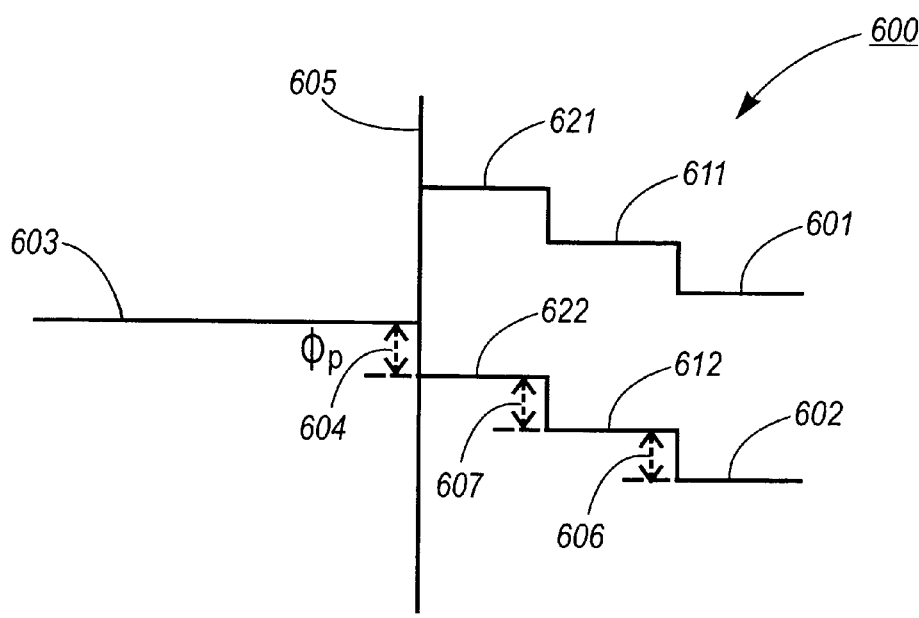
FIG. 6 schematically illustrates the band lineup at the junctions between the metal contact layer, the semiconductor contact interlayers and the group III–V semiconductor layer in the semiconductor structure shown in FIG. 5.

FIG. 6 schematically illustrates the band lineup at the junctions between the metal layer 130 and the group III–V semiconductor layers 110,120 and 125 in the semiconductor structure 500 shown in FIG. 5. As in FIG. 4, the band bending at the metal-group III–V semiconductor junction 605 is again not shown for simplicity. As shown in the band diagram 600, there are multiple stair-like structures in the band structure of the semiconductor device between the valence bands 602, 612 and 622, and the conduction bands 601, 611 and 621, respectively. This particular band structure is created by using a plurality of group III–V semiconductor contact interlayers between the first group III–V semiconductor layer 110 and the metal layer 130. In this example, the semiconductor contact interlayer 125 closest to the metal semiconductor junction 605 may be a layer of gallium phosphide, while the semiconductor contact interlayer 120 between the gallium phosphide layer 125 and the first group III–V semiconductor layer 110 may be gallium nitride phosphide.

The valence-band offset 606 is the energy difference between the valence band 602 of the first group III–V semiconductor layer 110 and the valence band 612 of the first semiconductor contact interlayer 120. The valence-band offset 607 is the energy difference between the valence band 612 of the first semiconductor contact interlayer 120 and the valence band 622 of the second semiconductor contact interlayer. The Schottky barrier height $\phi_p$ 604 is the energy difference between the metal Fermi level 603 and the valence band 622 of the second semiconductor contact interlayer 125. It should be appreciated that the original Schottky barrier height $\phi_p$ 204 shown in FIG. 2 is further divided between the Schottky barrier height $\phi_p$ 604 and the two valence-band offsets 606 and 607 (or more if additional semiconductor contact interlayers were present). Additionally, it should be appreciated that there may be three or more semiconductor contact interlayers, each having, for example, a different ratio of phosphide to nitride.

Figure 7:
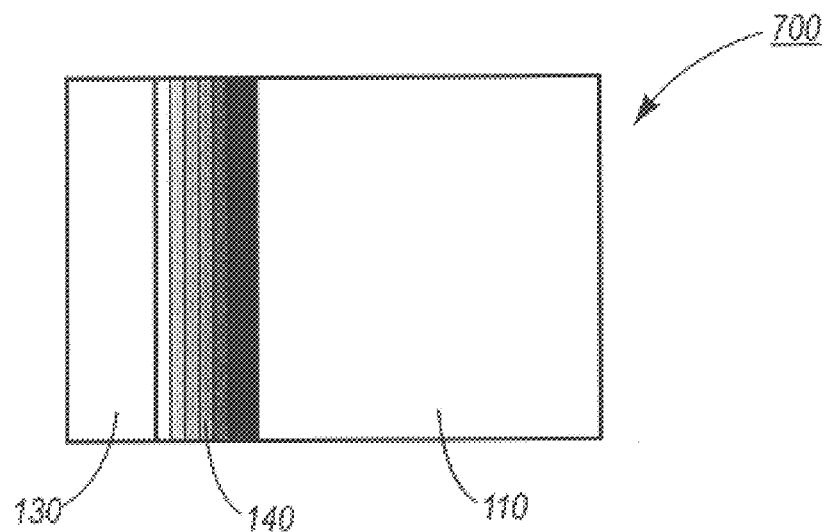
FIG. 7 shows the structure of a third exemplary embodiment of a semiconductor device having at least one variable semiconductor contact interlayer between the metal contact layer and the group III–V semiconductor structure according to this invention.

FIG. 7 shows the structure of a third exemplary embodiment of semiconductor device 700 according to this invention. As shown in FIG. 7, the semiconductor device 700 includes the group III–V layer 110, a second group III–V layer 140 formed on or over the first group III–V layer 110 and the metal layer 130 formed on or over the second group III–V layer 140. In particular, in this third exemplary embodiment, the second group III–V layer 140 has a varying concentration of two or more group V materials. For example, if the second group III–V layer 140 included nitrogen and phosphorous as the group V materials, the concentration of the group V materials could vary according to the formula $GaN_{1-x}P_x$, where the phosphorous concentration x increases with depth in the second group III–V layer 140 from a surface closest to the first group III–V layer.

That is, the group III–V material of the portion of the second group III–V layer 140 that is closest to the first group III–V semiconductor layer 110 might be gallium nitride. At the same time, the group III–V material of the portion of the second group III–V layer 140 that is closest to the metal layer 130 may be gallium nitride phosphide $GaN_{1-x}P_x$ with a given alloy concentration x. In particular, the portion of the second group III–V layer 140 that is closest to the metal layer 130 could be pure GaP, where x is equal to 1. In this structure, the composition of the gallium nitride phosphide in the middle of the group III–V layer 140 varies between these two extremes.

In various exemplary embodiments, the concentration of the group V materials varies linearly within the second group III–V layer 140. However, it should be appreciated that, in various exemplary embodiments, the group V material that varies across the thickness of the second group III–V layer 720 can vary according to any desired continuous or non-continuous function. However, it should be appreciated that the actual concentrations will vary depending on various factors, including deposition method, temperature, and time constraints. Thus, in practice, the actual concentration variation along the thickness of the second group III–V layer may even be abrupt, and may appear, as shown in FIG. 5, as discrete layers.

Figure 8:
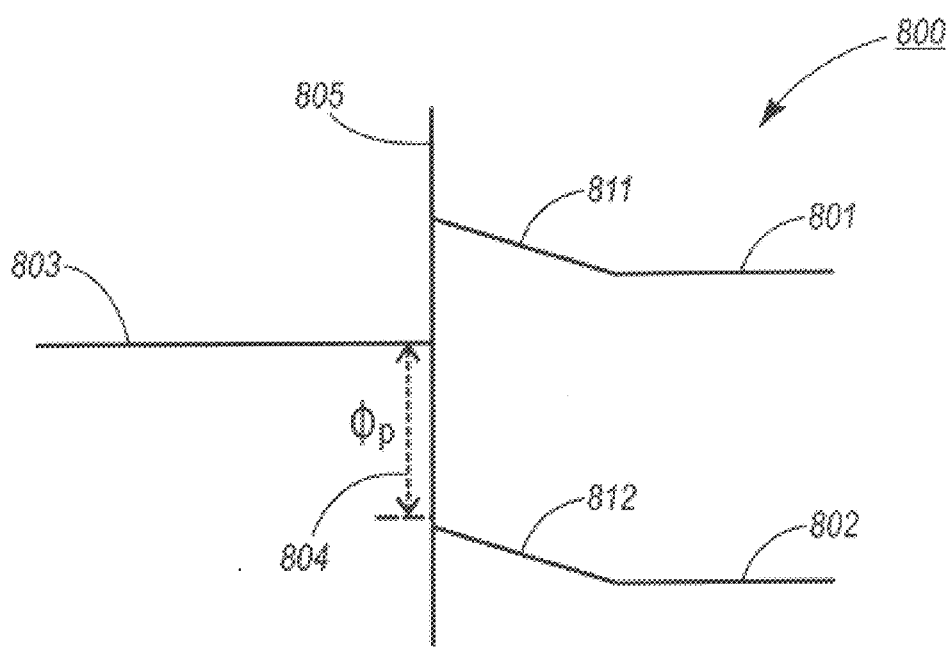
FIG. 8 schematically illustrates the band lineup at the junctions between the metal contact layer, the variable semiconductor contact layer and the group III–V semiconductor layer in the semiconductor structure shown in FIG. 7.

FIG. 8 schematically illustrates the band diagram for the third exemplary embodiment of the semiconductor structure 700 shown in FIG. 7. As shown in FIG. 8, the band diagram 800 has a continuously varying gradient in the conduction band 811 and the valence band 812 of the second group III–V layer 140 situated between the first group III–V layer 110 and the metal layer 130. In contrast, the conduction band 801 and the valence band 802 of the first group III–V layer 120 generally does not have a gradient, as in the other exemplary embodiments, although it could. Again, as in FIGS. 4 and 6, the band bending occurring at the metal semiconductor junction 805 is not shown for simplicity. Similarly, the Fermi level 803 of the metal layer 130 and the Fermi levels of the second group III–V layer 140 and the first group V semiconductor layer 110 must generally align.

It should be appreciated that, as noted earlier, the actual gradient within the second group III–V layer 140 may not be as continuous or smooth as that shown in FIG. 8. Small steps may be created depending on the processing condition as mentioned before. The small steps may even appear to be similar to that shown in FIG. 6. It should further be appreciated that the exemplary embodiments shown in FIGS. 5–8 could be combined, such that two or more interlayers could be provided, where at least one interlayer has a varying composition. Moreover, two interlayers having gradients having different slopes could be provided as the at least two interlayers.

It should also be appreciated that the composition of the semiconductor interlayer closest to the metal layer 130 can be varied by diffusing a portion of the metal layer closest to the adjacent semiconductor interlayer into that semiconductor interlayer, or vice-versa.

It should be appreciated that any number of different methods could be used to form the group III–V contact interlayers according to this invention, such as gallium phosphide on gallium nitride. However, the miscibility of these alloys is low. Hence, in various exemplary embodiments, non-equilibrium growth at low temperatures may be used. In various other exemplary embodiments, molecular beam epitaxy or metal-organic chemical vapor deposition may be used. It should be appreciated that there is no particular requirement to deposit the gallium nitride phosphide contact interlayer using the same growth technique used to form the underlying nitride-based semiconductor structures. Since the group III–V contact interlayers are formed over a top surface of the group III–V semiconductor device, the other layers and/or structures of the group III–V semiconductor device can be grown first using the one or more growth techniques of choice. Each of the one or more group III–V contact interlayers can be deposited using a desired technique.

It should further be appreciated that the metal layer 130 can itself be a single layer formed using a single metal, a single layer formed using a number of different metals, or a single layer formed using one or more metals and one or more non-metals. The metal layer 130 can also be formed as a plurality of separate sublayers, where each sublayer can be formed using a single metal, a number of different metals, or one or more metals and one or more non-metals. In particular, the specific composition of the metal layer is not important to the operation or scope of the systems and methods of this invention. Rather, the only parameter of the metal layer that need be considered is the Fermi level of the portion of the metal layer that is immediately over the adjacent semiconductor interlayer.

Finally, it should be appreciated that electronic devices that could make use of the semiconductor structures or devices shown in FIGS. 1 and 4–8 include transistors, sensors, optoelectronic devices, diodes, optical detectors, laser diodes and light emitting diodes. Furthermore, systems that incorporate such electronic devices include display devices, black and white or color image forming devices, optical communication devices, optical storage devices, black and white or color facsimile machines, black and white or color laser printers, black and white or color multipurpose devices, fiber-optic networks, microprocessors, gate arrays, radio-frequency transmitters and receivers, and digital signal processors.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A semiconductor device comprising:
   a first p-doped group III–V semiconductor layer having a first conduction band energy level and a first valence band energy level,
   a second p-doped group III–V semiconductor layer formed over the first p-doped group III–V semiconductor layer, and having a second conduction band energy level and a second valence band energy level; and
   a metal layer formed over the second p-doped group III–V semiconductor layer and having a Fermi energy level, wherein the Fermi energy level is above the first and second valence band energy levels and the second valence band energy level is between the Fermi energy level of the metal and the first valence band energy level.

2. The semiconductor device of claim 1, wherein the first p-doped group III–V semiconductor layer comprises at least one of gallium nitride and an alloy of gallium nitride.

3. The semiconductor device of claim 1, wherein the second p-doped group III–V semiconductor layer comprises at least one of gallium phosphide and at least one gallium phosphide nitride alloy.

4. The semiconductor device of claim 1, wherein a portion of the metal layer is diffused into the second p-doped group III–V semiconductor layer.

5. The semiconductor device of claim 1, wherein the metal layer comprises at least one of gold, nickel, palladium, or platinum.

6. The semiconductor device of claim 1, wherein:
   the second p-doped group III–V semiconductor layer comprises a plurality of p-doped group III–V semiconductor sublayers;
   each p-doped group III–V semiconductor sublayer has a different composition and a distinct valence-band energy level; and
   the distinct valence-band energy levels of the plurality of p-doped group III–V semiconductor sublayers are ordered in increasing order from the first valence-band energy level to the Fermi energy level.

7. The semiconductor device of claim 1, wherein the second p-doped group III–V semiconductor layer comprises a p-doped group III–V semiconductor layer having a varying composition across its thickness, a valence-band energy level of the second p-doped group III–V semiconductor layer varying from at least the first valence-band energy level to at most the Fermi energy level across its thickness.

8. The semiconductor device of claim 7, wherein the valence-band energy level of the second p-doped group III–V semiconductor layer varies substantially linearly across its thickness.

9. The semiconductor device of claim 7, wherein the valence-band energy level of the second p-doped group III–V semiconductor layer varies substantially continuously across its thickness.

10. The semiconductor device of claim 1, wherein the second p-doped group III–V semiconductor layer comprises a plurality of p-doped group III–V semiconductor sublayers, at least one of the plurality of p-doped group III–V semiconductor sublayers having a varying composition across its thickness such that, for each p-doped group III–V semiconductor sublayer that has a varying composition across its thickness, a valence-band energy level of that second p-doped group III–V semiconductor sublayer varies across the thickness of that second p-doped group III–V semiconductor sublayer.

11. The semiconductor device of claim 10, wherein the valence-band energy level of at least one of the at least one p-doped group III–V semiconductor sublayer that has a varying composition across its thickness varies substantially linearly across the thickness of that second p-doped group III–V semiconductor sublayer.

12. The semiconductor device of claim 10, wherein the valence-band energy level of at least one of the at least one p-doped group III–V semiconductor sublayer that has a varying composition across its thickness varies substantially continuously across the thickness of that second p-doped group III–V semiconductor sublayer.

13. The semiconductor device of claim 10, wherein the plurality of p-doped group III–V semiconductor sublayers comprises:
   a first sublayer having a varying composition across its thickness; and
   a second sublayer having a generally constant composition across its thickness.

14. The semiconductor device of claim 10, wherein the plurality of p-doped group III–V semiconductor sublayers comprises:

a first sublayer having a varying composition across its thickness, the composition of the first sublayer varying across the thickness of the first sublayer according to a first function; and a second sublayer having a varying composition across its thickness, the composition of the second sublayer varying across the thickness of the second sublayer according to a second function that is different that the first function.

15. An electronic device, comprising the semiconductor device of claim 1.

16. The electronic device of claim 15, wherein the electronic device is one of a transistor, a sensor, an optoelectronic device, a diode, an optical detector, a laser diode and a light emitting diode.

17. An image forming apparatus, comprising at least one electronic device of claim 16.

18. The image forming apparatus of claim 17, wherein the image forming apparatus is one of a laser printer, a digital copier, a facsimile machine, a color laser printer, a color digital copier, a color facsimile machine, and a multipurpose image forming device.

19. An electronic system, comprising at least one electronic device of claim 16.

20. The electronic system of claim 19, wherein the electronic system is one of a display device, an image forming device, an optical communication device, an optical storage device, a facsimile machine, a laser printer, a fiber-optic network, a microprocessor, a gate array, a radio-frequency transmitter, a radio-frequency receiver, and a digital signal processor.

* * * * *

UNITED STATES PATENT AND TRADEMARK OFFICE
CERTIFICATE OF CORRECTION

| | | |
|---|---|---|
| PATENT NO. | : 6,605,832 B2 | |
| APPLICATION NO. | : 09/682174 | |
| DATED | : August 12, 2003 | |
| INVENTOR(S) | : Christian G Vandewalle | |

It is certified that error appears in the above-identified patent and that said Letters Patent is hereby corrected as shown below:

Column 1, line 3, insert as a new paragraph:

This invention was made with Government support under Agreement No. MDA972-96-3-0014 awarded by ARPA. The Government has certain rights in this invention.

Signed and Sealed this

Eighth Day of August, 2006

JON W. DUDAS
*Director of the United States Patent and Trademark Office*